United States Patent [19]
Suda et al.

[11] 3,942,485
[45] Mar. 9, 1976

[54] FUEL INJECTION APPARATUS

[75] Inventors: Seiji Suda, Mito; Tomoji Inui, Katsuta, both of Japan

[73] Assignee: Hitachi, Ltd., Japan

[22] Filed: Dec. 26, 1973

[21] Appl. No.: 427,993

Related U.S. Application Data

[63] Continuation-in-part of Ser. No. 185,056, Sept. 30, 1971, abandoned.

[30] Foreign Application Priority Data

Oct. 7, 1970    Japan.................................. 45-87555

[52] U.S. Cl......... 123/32 AE; 123/32 EA; 251/137; 251/297
[51] Int. Cl.......................... F02b 3/00; F02m 39/00
[58] Field of Search........ 251/137, 297; 123/32 AE, 123/32 EA, 139 E

[56]    References Cited
UNITED STATES PATENTS

| | | | |
|---|---|---|---|
| 1,200,375 | 10/1916 | Litle..................................... | 251/137 |
| 1,819,452 | 8/1931 | Wright................................. | 251/137 |
| 1,883,766 | 10/1932 | Cox..................................... | 251/137 |
| 2,077,259 | 4/1937 | Planiol............................. | 123/32 EA |
| 2,852,308 | 9/1958 | Whitson .......................... | 123/32 EA |
| 3,004,720 | 10/1961 | Knapp ............................ | 123/32 AE |
| 3,165,120 | 1/1965 | Horowitz ............................ | 251/297 |
| 3,178,151 | 4/1965 | Caldwell.............................. | 251/137 |
| 3,412,971 | 11/1968 | McDivitt............................. | 251/137 |
| 3,450,353 | 6/1969 | Eckert............................ | 123/32 AE |
| 3,476,133 | 11/1969 | Stedfeld.............................. | 251/297 |
| 3,477,468 | 11/1969 | Kopaska ............................. | 251/297 |
| 3,565,048 | 2/1971 | Monpetit........................ | 123/32 EA |
| 3,666,231 | 5/1972 | Parodi................................. | 251/137 |
| 3,688,495 | 9/1972 | Fehler................................. | 251/297 |

*Primary Examiner*—Charles J. Myhre
*Assistant Examiner*—Ronald B. Cox
*Attorney, Agent, or Firm*—Craig & Antonelli

[57]            ABSTRACT

A fuel injection apparatus has two magnetic coils, a valve-opening magnetic coil and a valve-closing magnetic coil. During the valve opening operation the magnetic force caused by the valve opening magnetic coil moves the movable armature toward the opening position for discharging the fuel into the engine and during the valve closing operation the magnetic force caused by the valve-closing magnetic coil moves the movable armature to the closing position for stopping the fuel injection, so that the response time of the fuel injection apparatus is shortened.

3 Claims, 15 Drawing Figures

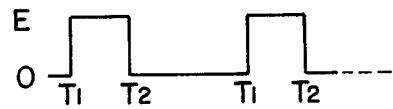
FIG. 4a
FIG. 4b
FIG. 4c
FIG. 5
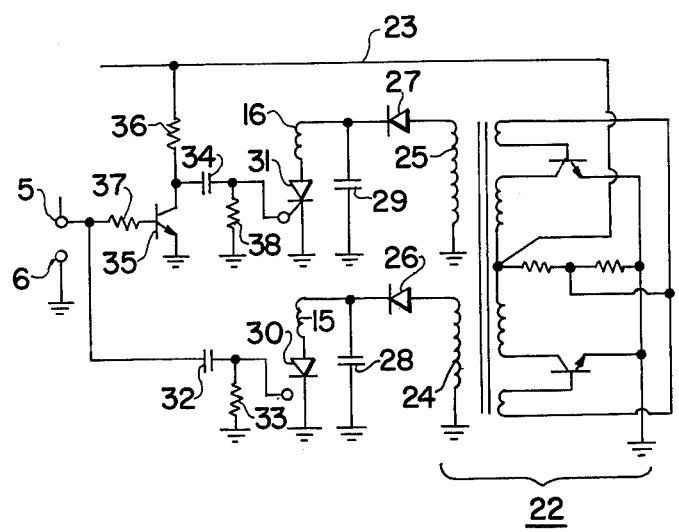
FIG. 6a
FIG. 6b
FIG. 6c

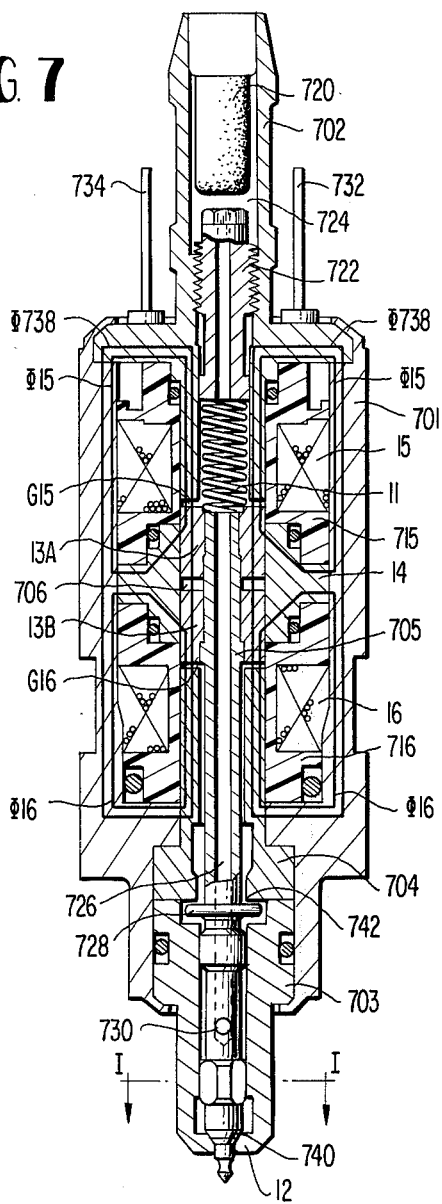

1

FUEL INJECTION APPARATUS

CROSS-REFERENCE TO RELATED APPLICATIONS

This is a continuation-in-part application of application Ser. No. 185,056 filed Sept. 30, 1971 now abandoned.

BACKGROUND OF THE INVENTION

This invention relates to a fuel injection system for internal combustion engines, particularly to improvements therein.

It is well known that an electrically operated injection apparatus is used as an injecting device which is supplied with fuel for an interval combustion engines. In conventional fuel injection wherein the nozzle opening time of the fuel injection apparatus is determined by the load on the engine, the number of engine revolutions per minute and temperature, etc., of the engine, a movable armature of the injection apparatus is pushed by a spring toward the closing position, so that the supply of fuel to the engine is stopped. When a magnetizing current flows into a magnetic coil, the movable armature of the injection apparatus is pulled by an electromagnetic force toward the opening position against the action of the spring, so that the fuel is discharged into the engine. When the magnetizing current is discontinued, the movable armature is returned to its normal closing positon from the opening position by the action of the spring. In such an injection apparatus, however, in order to make high the closing response of the electrically operated injection apparatus, the spring force should be set at a large value especially for the returning action. On the other hand, when the spring force is made large, the opening operation requires a long period of time because of the large spring force acting against the opening force. Thus in order to shorten the time for the valve-opening action, it is necessary that the magnetizing current flowing into the magnetizing current flowing into the magnetic coil is large. Since there are various difficult problems in that a great deal of the magnetizing current must be turned off in a very short period of time and a large quantity of magnetic energy stored by a magnetizing current must be discharged in an instant, it has been difficult to realize an injection apparatus having a excellent response.

SUMMARY OF THE INVENTION

It is a main object of the present invention to provide an injection apparatus which has a short response time.

It is a further object of the invention to overcome the disadvantages of the injection apparatuses according to the prior art.

The injection apparatus of the present invention has two magnetic coils, one magnet coil being used for moving a movable armature to the opening positon from the closing position and other magnetic coil being used for moving it to the closing position from the opening position. Thus, the present apparatus does not need the large force of a spring which is used to return the movable armature to the closing position from the opening position.

Additionally, since the magnetizing current flowing into the opening magnetic coil, which produces the magnetic force moving the movable armature against the spring action, can be small, since the spring force is small or zero, it is easy to change the value of the magnetizing current to zero or any other appropriate value and also a circuit producing the magnetizing current can be easily constructed.

BRIEF DESCRIPTION OF THE DRAWINGS

FIGS. 4a to 4c are wave-form diagrams of the operating voltages of the embodiment of FIG. 3, FIG. 5 is an electrical connection diagram of means for energizing a magnet valve, FIGS. 6a, b, and c are wave-form diagrams of the operating voltages of the means of FIG. 5, FIGS. 7, 8 and 9 show the details of a fuel injection apparatus of the invention wherein FIG. 8 is a top view of the injection valve of FIG. 7, FIG. 9 is a sectional view of a fuel guide along the line I—I of FIG. 7.

DETAILED DESCRIPTION OF THE INVENTION

Figure 1:
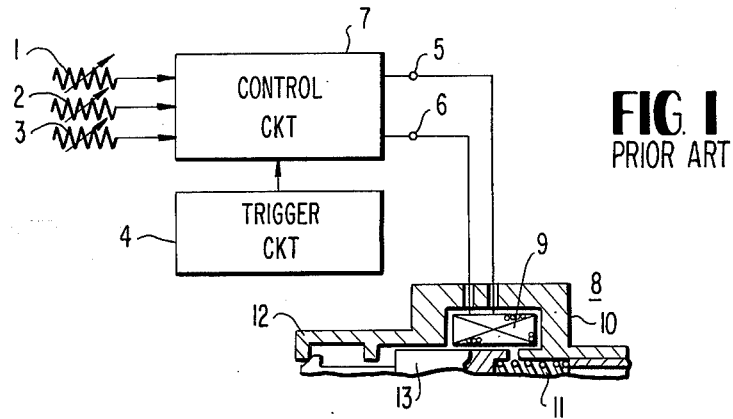
FIG. 1 is an electrical block diagram of a prior-art device.

At first, the defects of the prior art will be discussed with reference to FIGS. 1 and 2. FIG. 1 shows a fuel control device which has heretofore been suggested, and which comprises a first converter means 1 for converting the loaded state of an engine into electrical signals, a second converter means 2 for converting the number of revolutions per minute into electrical signals, a third converter means 3 for converting the temperature of the engine into electrical signals, a trigger circuit 4 which feeds a signal into a control circuit 7 when the engine begins the suction stroke, and a control circuit 7 which receives as input signals the respective outputs of said first to third converter means and which generates across output terminals 5 and 6 pulse-shaped voltages of a time width T which correspond to the input signals. As injection apparatus 8 has a solenoid coil 9 connected to the output terminals 5 and 6 of the control circuit 7, a housing 10 and a spring 11 which pushes a movable armature 13 against a valve seat 12.

Figure 2A:
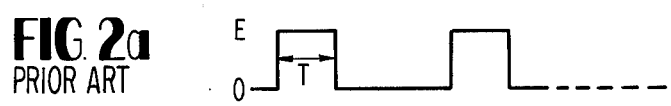
FIG. 2a and b are wave-form diagrams of the operating voltages of the prior art device.

When the engine begins the suction stroke, the trigger circuit 4 generates a trigger signal to be applied to the control circuit 7 which produces across the output terminals 5 and 6 and output voltage E as shown in FIG. 2a. The solenoid coil 9 is thus energized, whereby the injection apparatus 8 is opened to start the fuel supply. The output voltage E is held for a period of the time T which is obtained by calculating the electrical signals applied from the first to third converter means 1 to 3 and thereafter it disappears.

In this manner, by maintaining constant the inflow pressure of fuel to the injection apparatus 8, the amount of the fuel fed from the injection apparatus 8 becomes the function of the period of time T. Namely, it seems that the optimum supply of the fuel can be realized by calculating the period of time T on the basis of the electrical signals which are generated by the converter means 1 to 3.

Figure 2B:
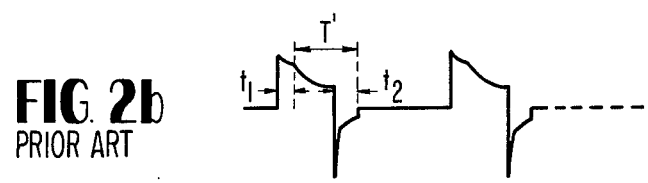

In actuality, however, the terminal voltage across the output terminals 5 and 6 connected to the solenoid coil 9 varies as illustrated in FIG. 2b, because of the relation between variations in the impedance of the solenoid coil 9 and the output impedance of the control circuit 7. More specifically, since the movable armature 13 is moved by causing current to flow through the solenoid coil 9, the permeance of the magnetic circuit varies, thus the impedance of the solenoid coil 9 changes with the movement of the movable armature. A point of the inflation in the voltage variations is presented after the lapse of a period of time $t_1$ and shows that the operation of opening the valve has been completed. The period of time $t_1$ becomes the valve-opening delay time. Such a phenomenon occurs also at the valve-closure action.

When the current flowing into the solenoid coil 9 is interrupted, a counter electromotive force is produced by stored electromagnetic energy.

Until the counter electromotive force is attenuated by a leakage current, the valve-closure action may not be completed; thus, it is completed at a point of inflexion after a period of $t_2$ which is needed to dissipate said counter electromotive force.

As a result, such delay times become a serious obstruction to the fuel supply to an internal combustion engine in which both the actions are repeated at very short intervals (since the valve-closure period of time becomes short at high-speed rotation, the valve-opening period disadvantageously overlaps it).

Description will now be made of the present invention with reference to FIG. 3. An injection apparatus 8 has a housing 10 and two magnetic coils 15 and 16 which are divided by an intermediate wall 14.

A hole 17 communicating with the outside is provided in the intermediate wall 14, and an incorporated spherical body 18 is therein brought into pressed contact with a movable armature 13 by means of a coiled spring 19, so as to prevent the movable armature 13 from rocking due to vibration etc. A coil spring 11 presses against the movable armature 13, so that fuel injection is stopped. An opening circuit 20 causes a temporary current to flow to the valve-opening magnetic coil 15 at the valve opening action, while a closing circuit 21 causes a temporary current to flow to the valve-closure magnetic coil 16 at the valve-closure action. These two magnetic coils 15 and 16 are connected to output terminals 5 and 6 of a control circuit 7. The housing 10 has a discharge portion formed with a valve seat 12 contacting the top of the armature 13 and an inlet portion, not shown. The fuel applied from said inlet portion flows in the space between the magnets 15 and 16 and the armature 13 reaches the discharge portion. In this device it is possible to provide grooves on the movable armature for smoothing the flow of fuel.

The control circuit 7 is to be constructed such that, as in the prior art, electrical signals delivered from a converter means 1 to 3 are converted into a time width T output signals. The opening circuit 20 differentiates the rising variation of the output voltage of the control circuit to thus cause current to flow into the valve-opening magnet coil 15, while the closing circuit 21 differentiates the falling variation of the output voltage of the control circuit 7 to thus cause current to flow into the valve closing magnet coil 16.

Figure 3:
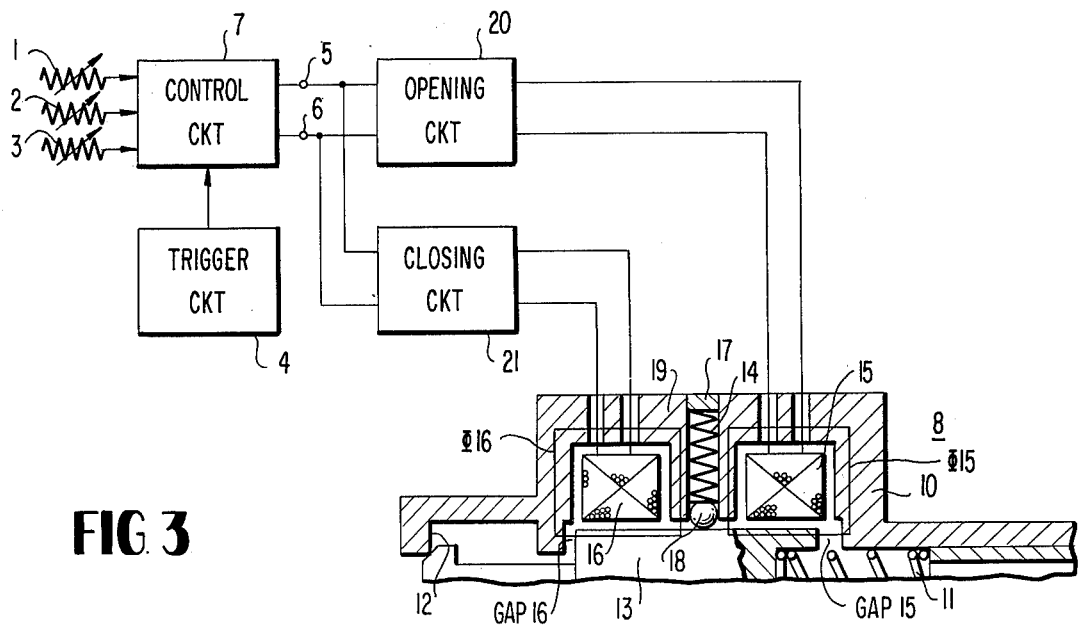
FIG. 3 is an electrical block diagram showing an embodiment of a device of the present invention.

In the case where, with the above construction, an output pulse as shown in FIG. 4a is obtained from the control circuit 7, the opening circuit 20 causes current to flow through the magnetic coil 15 as illustrated in FIG. 4b at time $T_1$ at the rising of the output pulses of the control circuit 7, thereby moving the movable armature 13 in the injection apparatus 8 rightwards, as viewed in FIG. 3 to open the valve.

On the other hand, the closing circuit 21 causes a current to flow through the magnetic coil 16 as illustrated in FIG. 4c at time $T_2$ of the falling of the output of the control circuit 7, therreby moving the movable armature 13 leftwards, as viewed in FIG. 3, to close the valve. When the movable armature is moved to the opening position, the effect of the friction caused between the armature 13 and incorporated spherical body 18 holds the armature 13 at that position in spite of the action of the spring 11.

In case a large friction effect is needed between said armature 13 and the incorporated spherical body 18, a small groove or hole in which a part of the body 18 is held down is provided on a suitable part of the movable armature 13, so that, when the movable armature has completely moved toward the right, the body 18 contacts the groove. The causes of the delaying operation in the process of conventional valve-opening or valve-closing action are, as stated previously, the stored electromagnetic energy and the reaction of the coiled spring 11 for the valve closure. According to the present invention, however, the electromagnetic energy at the valve opening is completely discharged before the valve closure operation and the reaction of the coil spring 11 may also be set at a much smaller value than for the conventional one. Therefore, the response may be further improved. In this case it is also performable, instead of the provision of the coiled spring 11 to cause a bias current to flow through the magnetic coil 16 for closing the valve. This bias current may be interrupted to improve the response characterization at the opening action. Furthermore, it becomes possible to stably hold the movable armature in the opening position by applying a bias current to the magnetic coil 15. Even if the bias current is applied simultaneously to both the magnetic coils 15 and 16, no problem occurs, since, when the movable armature 13 is presented at the closed position, the force acting upon the movable armature 13 from the valve-closing magnetic coil 16 is larger than that from the valve-opening magnetic coil 15. On the other hand, when the movable armature 13 is in the opened position due to the differences of the permeance in the magnetic circuit between the two positions, the force acting upon the movable armature 13 from the valve-opening magnetic coil 15 is larger than that from the valve-closing magnetic coil 16. However, where the valve is intended to be opened from the closed state, it enhances more the response to the interrupt the bias current of the magnetic coil 16 on the valve-closure side. This is also true where the valve is intended to be closed from the opened state.

Referring now to FIGS. 5 and 6, a description will be made of electrical circuit means which is very effective in order to temporarily and strongly energize the magnetic coils 15 and 16 on the basis of the output voltage obtained from the control circuit 7.

In FIG. 5, reference numeral 22 indicates a Royer oscillator circuit, the primary side of which is connected to a power-source line 23.

On the secondary side, there are provided two high-voltage output windings 24 and 25, which are arranged so as to charge capacitors 28 and 29 through rectifiers 26 and 27, respectively. Connected to the capacitor 28 through a thyristor 30 is the magnetic coil 15 for the valve opening in the solenoid valve 8, while connected to the capacitor 29 through a thyristor 31 is the magnetic coil 16 for the valve closure. The gate of the thyristor 30 is connected through a differentiating capacitor 32 to the output terminal 5 of the control circuit 7. Shown at 33 is a discharging resistor for the capacitor 32. On the other hand, the gate of the thyristor 31 is connected through a differentiating capacitor 34 to the collector of an NPN-type transistor 35. The transistor 35 has the emitter grounded, has the collector connected through a resistor 36 to the power-source line 23, and has the base connected through a resistor 37 to the output terminal 5 of the calculation means 7. A resistor 38 is a discharging one for the differentiating capacitor 34, and the other output terminal 6 of the calculation means 7 is grounded.

With the above construction, the capacitors 29 and 30 are charged at approximately 200V during running. Thus where an output voltage is generated across the output terminals 5 and 6 of the control circuit 7 as is illustrated in FIG. 6a, it is differentiated as shown in FIG. 6b by the capacitor 32 and triggers the gate of the thyristor 30. The thyristor 30 is thereby brought into the conducting state, with the result that charges stored in the capacitor 28 are discharged through the magnetic coil 15 to energize it to open the valve. Simultaneously, the transistor 35 becomes conductive, with the result that a discharging circuit is established through the resistor 38 for the capacitoor 34, to cause said capacitor 34 to discharge. At this time, the thyristor 31 is held non-conductive.

At the discharge of the capacitor 28, when the thyristor 30 is rendered conductive, an oscillation phenomenon occurs through the capacitor 28 and the inductance of the magnetic coil 15. A part of the vibration corresponding to the half period flows through the magnetic coil 15, and thereafter, the thyristor 30 is rendered non-conductive. Accordingly, if this half period is made to be a part of the beginning of the valve-opening period of time, the electromagnetic energy from this current will not adversely influence the valve-closure action. When, subsequently, the voltage at the output terminal 5 disappears, the transistor 35 is brought into the non-conducting state. As a result, the collector potential rises, and the voltage is differentiated by the capacitor 34 as illustrated in FIG. 6c and triggers the gate of the thyristor 31. The thyristor 31 is thereby rendered conductive, and similarly to the foregoing case, energizes the magnetic coil 16 to close the magnet valve 8.

Experimental examples have revealed that, in the prior art control device, the delay time in the valve-opening or valve-closing action amounts to 1.5ms to 2.0ms, whereas in the present invention, the delay time is approximately 100μs, hence the response time is far superior. In this connection, in the experimental examples of the present invention, the capacitors 28 and 29 were charged to 200V with ones of 2μF, while the discharging currents were pulse-shaped ones of 8A and 200μs.

It is also desirable in a fuel injection apparatus to decrease the spring force in order to effect high speed operation. Since a conventional fuel injector has only one magnet coil, the operation speed cannot reach a high level. The fuel injection valve of the present invention has two coils, one of which is for opening the other is closing. In addition, a pulse current having large value is applied when the valve is opened or closed.

It is, however, necessary in this type of device to maintain the position of the armature fixed. Referring to FIG. 3, when the magnetic coil 15 is energized, the armature 13 moves toward the right side against the spring 11. However, the energization of the coil 15 is immediately stopped. It is necessary to maintain the open position of the armature 13 fixed, and thus, the spherical body 18 and the spring 19 are provided. It is also possible to use a bias current instead of the body 18 and the spring 19.

If the same value of current is applied to the coils 15, 16 as a bias, fluxes $\Phi15$ and $\Phi16$ are caused. When the armature 13 is in the open position, since a gap 15 is smaller than a gap 16, the armature 13 is maintained in the open position. When the armature 13 is in the closed position, the armature 13 is maintained in the closed position, since the gap 15 is larger than the gap 16. Therefore, it is not necessary to provide the spherical body 18 and the spring 19.

Figure 10:
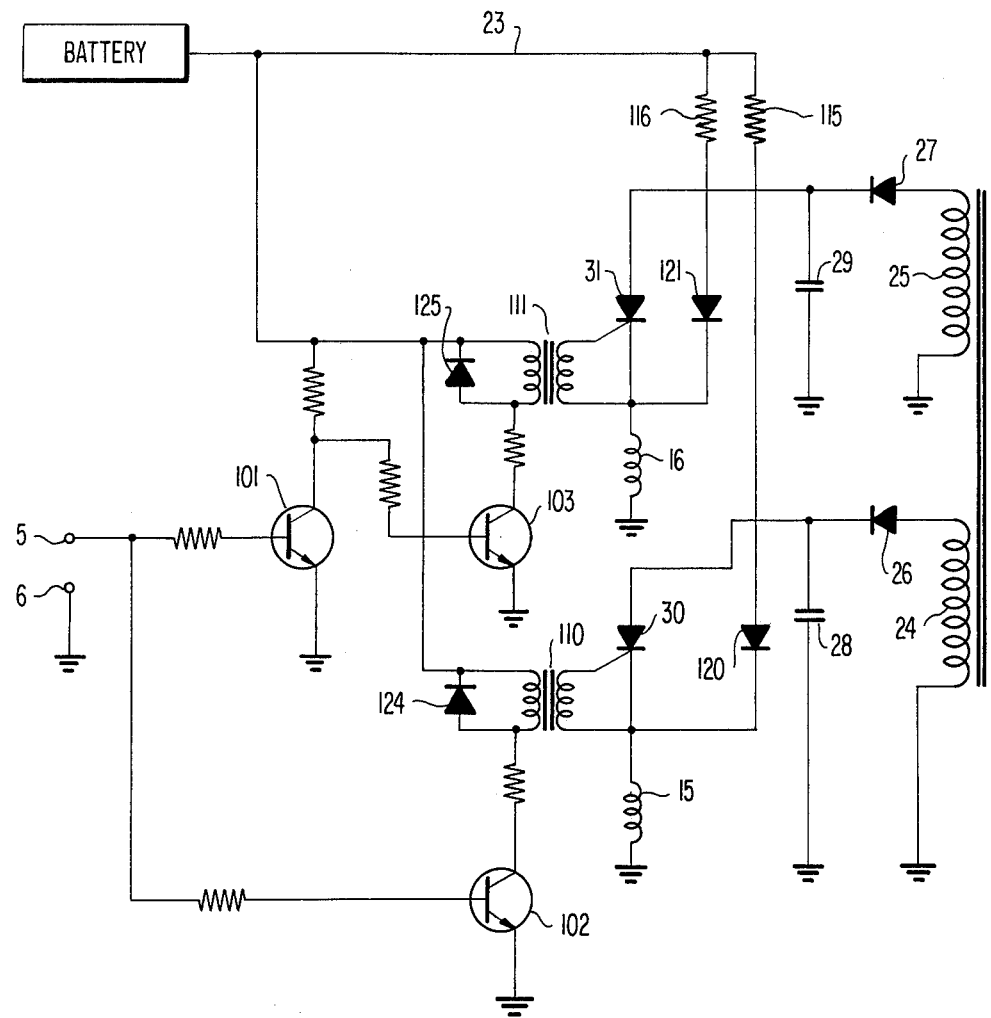
FIG. 10 shows a control circuit for the apparatus of FIGS. 7, 8 and 9.

The fuel injection of this type is shown in FIGS. 7, 8, 9 and control circuit thereof is shown in FIG. 10. A valve housing 701 has an inlet portion 702, an outlet portion 703, sleeve 704 and an intermediate portion 14. A coil bobbin 715 having an open coil 15 is provided between the inlet portion 702 and the intermediate portion 14. A coil bobbin 716 having a close coil 16 is provided on the down-side of the intermediate portion. The inlet portion has a filter 720 and an adjusting portion 722 in a hole 724. A stem 705 is pushed toward a valve sheet 12 of the outlet portion 703 by the spring 11. Armature 13a, 13b is provided on the stem 705 and separated from each other by a gap 706. The stem 705 has a hole 726 through which fuel is supplied to an opening 730 and has a flange 728 for determining the opening of an injection valve. The inlet portion 702 has terminals 732, 734 and 736 for the coils 15, 16. The down end of the stem 705 has four grooves on the outside for passing the fuel. A sectional view of the fuel guide of stem 705 is shown in FIG. 9.

Fuel is supplied through the filter 720, the hole of the adjusting portion 722, the spring room, the hole of the stem, the opening 730, gap between the outlet portion and the stem and cuttings of the down end to the valve portion.

A predetermined bias current is applied to the coils 15, 16 and causes flux $\Phi15$, $\Phi16$, as shown in FIG. 7. When the valve is closed, gap G16 is smaller than the gap G15, then the flux $\Phi16$ is larger than the flux $\Phi15$. The stem is pushed toward the down side and the valve is maintained in the closed position. When a pulse is applied in the open coil 15, the stem is moved to the open position because the flux $\Phi15$ is larger than the flux $\Phi16$ and then the gap G 15 is smaller than the gap G16. The valve is maintained in the open position.

When the engine is stopped and the bias current of the coils 15, 16 is also stopped, the valve is free from the magnetic force. The spring pushes the stem 705 to the closed position and prevents the fuel from leaking. Two armature 113a, 13b are separated by the gap 706 which prevents flux $\Phi738$ by the coil 15 or 16. The opening between the valve sheet 12 and a valve needle 740 is determined by the gap between the flange and a stopper edge 742 of the sleeve 704.

A control circuit of the additional embodiment is shown in FIG. 10. The differences between FIG. 10 and FIG. 5 are the additions of resistors 115, 116 and diodes 120, 121 for the bias current to coils 15, 16. The operation of the other element is the same as FIG. 5.

Alternating high voltages generated in coil 24, 25 are stored in condensers 28, 29 through diodes 26, 27.

When the pulses shown in FIG. 4a are applied between terminals 5, 6, transistors 101, 102 are turned on, at time $T_1$. The thyristor 30 is switched by a pulse caused by a pulse transformer 110. Since transistor 103 is turned off and the voltage induced caused in a primary coil of a transformer 111 is short-circuited by a diode 125, a pulse is not caused in secondary coil of the transformer 111.

During the time between time $T_1$ and time $T_2$, the valve position or the position of the stem 705 is maintained by the bias currents from the diodes 120 and 121. Namely, the gap G15 is smaller than the gap G16 and then the magnetic force of the coil 15 is larger than that of the coil 16. At time $T_2$, the transistor 103 is turned on, and the transistor 102 is turned off. The thyristor 31 is switched on by a pulse caused by a pulse transformer 111. A voltage caused in the primary coil of the pulse transformer 110 by turning off the transistor 102 is short-circuited by a diode 124, and a pulse is then not caused in secondary coil of the transformer 110. There is a large advantage in using the thyristor 30, 31 for applying the pulse current into the coils 15, 16. In general, a charge into a coil from a condenser creates a current vibration. The thyristor 30 or 31 prevents this vibration and applies one pulse into the coil 15 or 16.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. A fuel injection apparatus for an internal combustion engine comprising:
   housing means;
   inlet means, provided at one end of said housing means, for applying fuel to said housing means;
   discharging means, provided at the other end of said housing means, for discharging fuel from said housing means;
   movable means, having an open position and a closed position and being provided between said inlet and discharging means, for opening and closing said discharging means;
   first magnetic coil means for moving the movable means to the open position;
   second magnetic coil means for moving the movable means to the closed position;
   detent means provided between said first and second magnetic coil means;
   a first gap provided between said first magnetic coil means and said movable means through which first magnetic flux created by the first magnetic coil means passes;
   a second gap provided between said second magnetic coil means and said movable means through which second magnetic flux created by the second magnetic coil means passes;
   a spring means for pushing the movable means toward the closed position;
   a control circuit for generating pulse voltages which represent injection timings and the amount of fuel fed from the injection apparatus;
   first energizing means including a first capacitor and a first thyristor for energizing said first magnetic coil means in response to a pulse from the control circuit;
   second energizing means including a second capacitor and a second thyristor for energizing said second coil means in response to a pulse from the control circuit;
   first bias means including a first diode through which direct current is applied to said first magnetic coil means for supplying a first bias current to the first magnetic coil means;
   second bias means including a second diode through which direct current is applied to said second magnetic coil means for supplying second bias current to said second magnetic coil means; and
   capacitor charging means for charging said first and second capacitors, said capacitor charging means comprising an oscillator circuit including first and second high-voltage windings and first and second rectifiers, the voltage from said first high-voltage winding being applied to the first capacitor through the first rectifier and the voltage from said second high-voltage winding being applied to the second capacitor through the second rectifier.

2. A fuel injection apparatus in accordance with claim 1 wherein said first energizing means includes a first pulse transformer for triggering said first thyristor, and wherein said second energizing means includes a second pulse transformer for triggering said second thyristor.

3. A fuel injection apparatus for an internal combustion engine comprising:
   housing means;
   inlet means, provided at one end of said housing means, for introducing fuel into said housing means;
   discharge means, provided at the other end of said housing means, for discharging fuel from said housing means;
   movable means, displaceably provided within said housing means between said inlet means and said discharge means, said movable means including first and second armature portions affixed thereto;
   first magnetic coil means, magnetically coupled with said first armature portion of said movable means, for moving said movable means in a first direction to a first position, to open said discharge means, so as to discharge fuel from said housing means, said first armature portion forming with said housing means a first gap through which the flux generated by said first magnetic coil means passes;
   second magnetic coil means, magnetically coupled with said second armature portion of said movable means, for moving said movable means in a second direction, opposite said first direction, to a second position, to close said discharge means so as to prevent the discharge of fuel from said housing means, said second armature portion forming with said housing means, a second gap through which the flux generated by said second magnetic coil means passes; and
   circuit means, coupled to said first and second magnetic coil means, for supplying a bias current to each of said first and second magnetic coil means, and for supplying a first energizing current pulse to said first magnetic coil means, to open said discharge means, and for supplying a second energizing current pulse to said second magnetic coil means, to close said discharge means, said circuit means comprising first and second capacitor-storage-discharge circuits respectively coupled to said first and second magnetic coil means, each storage-discharge circuit including a storage capacitor, means for charging said storage capacitor to a prescribed voltage, a thyristor switch connected between the storage capacitor and a respective magnetic coil means, for controllably discharging the capacitor through the respective magnetic coil means, first and second diodes resistively coupled between a power supply and said first and second magnetic coil means, for supplying said bias current thereto, and an oscillator circuit including first and second high-voltage windings, and first and second rectifiers, the voltage from said first high-voltage winding being applied to a respective one of said storage capacitors through said first rectifier and the voltage from said second high-voltage winding being applied to a respective other of said storage capacitors through the second rectifier; and wherein said first gap is smaller than said second gap for said first position of said movable means and said second gap is smaller than said first gap for said second position of said movable means.

* * * * *